(12) United States Patent
Hickman

(10) Patent No.: US 8,508,082 B2
(45) Date of Patent: Aug. 13, 2013

(54) SOLAR ENERGY COLLECTION SYSTEMS AND METHODS

(76) Inventor: William E. Hickman, Bellaire, TX (US)

(*) Notice: Subject to any disclaimer, the term of this patent is extended or adjusted under 35 U.S.C. 154(b) by 372 days.

(21) Appl. No.: 12/819,213

(22) Filed: Jun. 20, 2010

(65) Prior Publication Data

US 2011/0308177 A1    Dec. 22, 2011

(51) Int. Cl.
*G05F 3/06* (2006.01)

(52) U.S. Cl.
USPC .......................................... 307/151; 307/147

(58) Field of Classification Search
USPC .......................................... 307/151, 43, 147
See application file for complete search history.

(56) References Cited

U.S. PATENT DOCUMENTS

| | | | |
|---|---|---|---|
| 7,177,168 B2* | 2/2007 | Toyomura et al. | 363/131 |
| 8,207,637 B2* | 6/2012 | Marroquin et al. | 307/147 |
| 2007/0145745 A1* | 6/2007 | Woods et al. | 290/1 A |
| 2008/0039989 A1* | 2/2008 | Pollack et al. | 701/22 |
| 2008/0276913 A1* | 11/2008 | Zubeck | 123/543 |
| 2009/0038673 A1 | 2/2009 | Ware | |
| 2009/0112758 A1* | 4/2009 | Herzig | 705/40 |
| 2009/0139562 A1 | 6/2009 | Thomas | |
| 2009/0296348 A1 | 12/2009 | Russell et al. | |
| 2010/0236162 A1* | 9/2010 | Tweedie | 52/127.6 |
| 2011/0203637 A1* | 8/2011 | Patton et al. | 136/244 |

* cited by examiner

*Primary Examiner* — Robert L. DeBeradinis
(74) *Attorney, Agent, or Firm* — William Hickman

(57) ABSTRACT

A solar electricity system, comprising a solar collection surface adapted to convert light into DC electricity; a power inverter to convert the DC electricity into AC electricity; and a power cable connected to the power inverter, the power cable comprising a male plug on its distal end adapted to mate with a female power receptacle on a building structure.

10 Claims, 10 Drawing Sheets

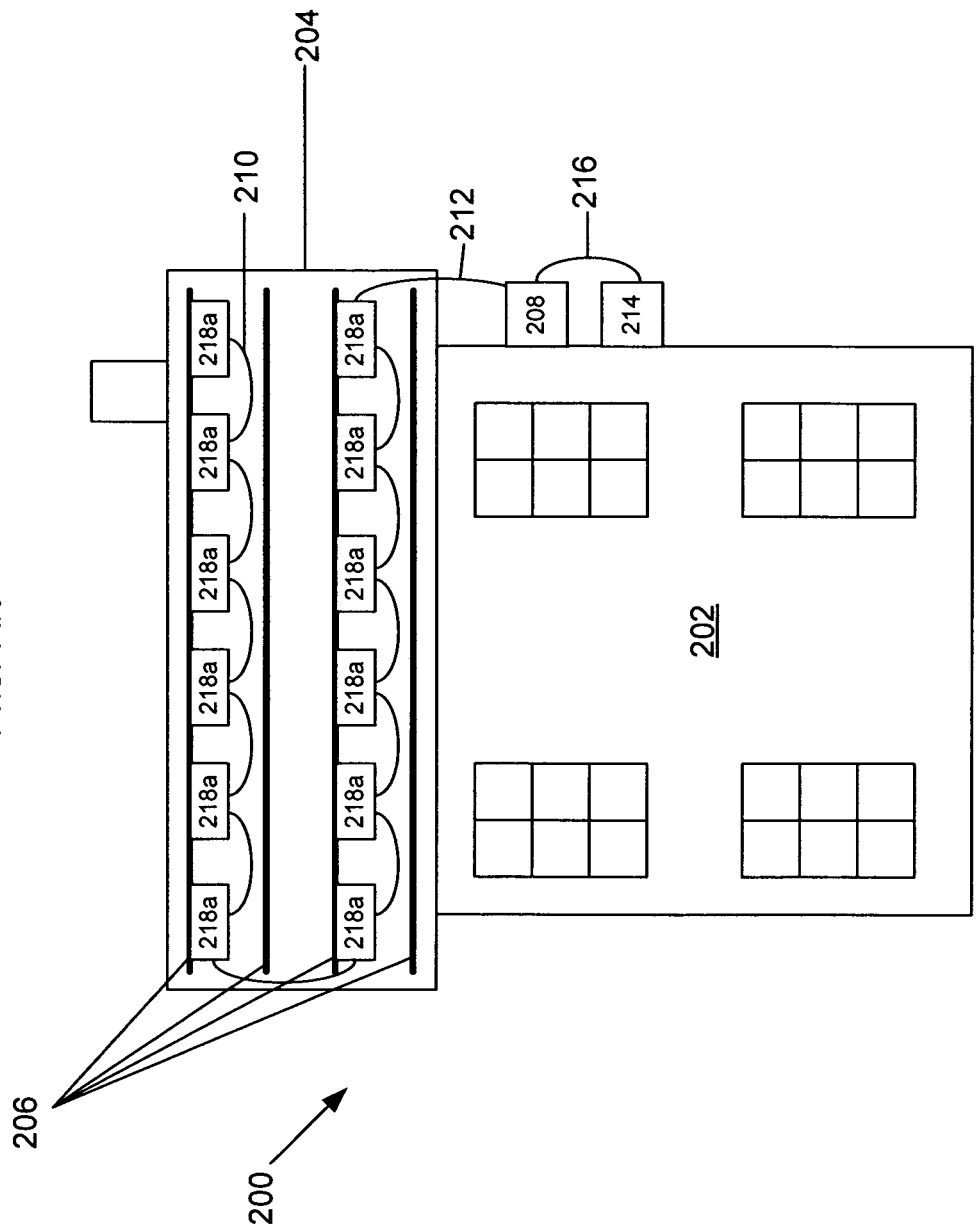

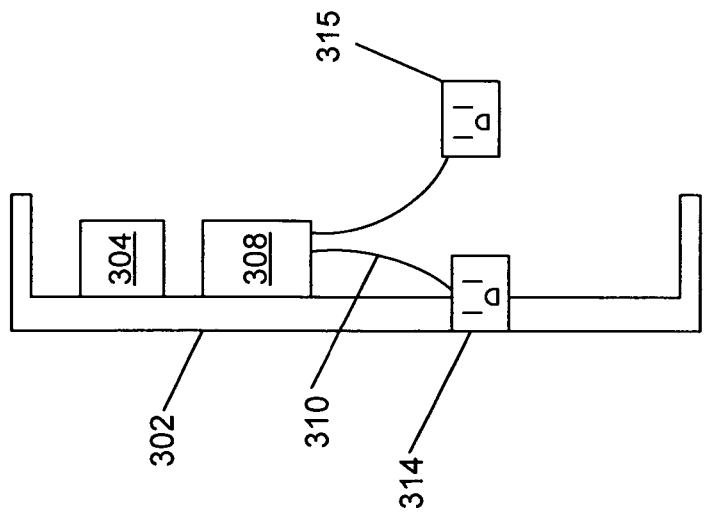
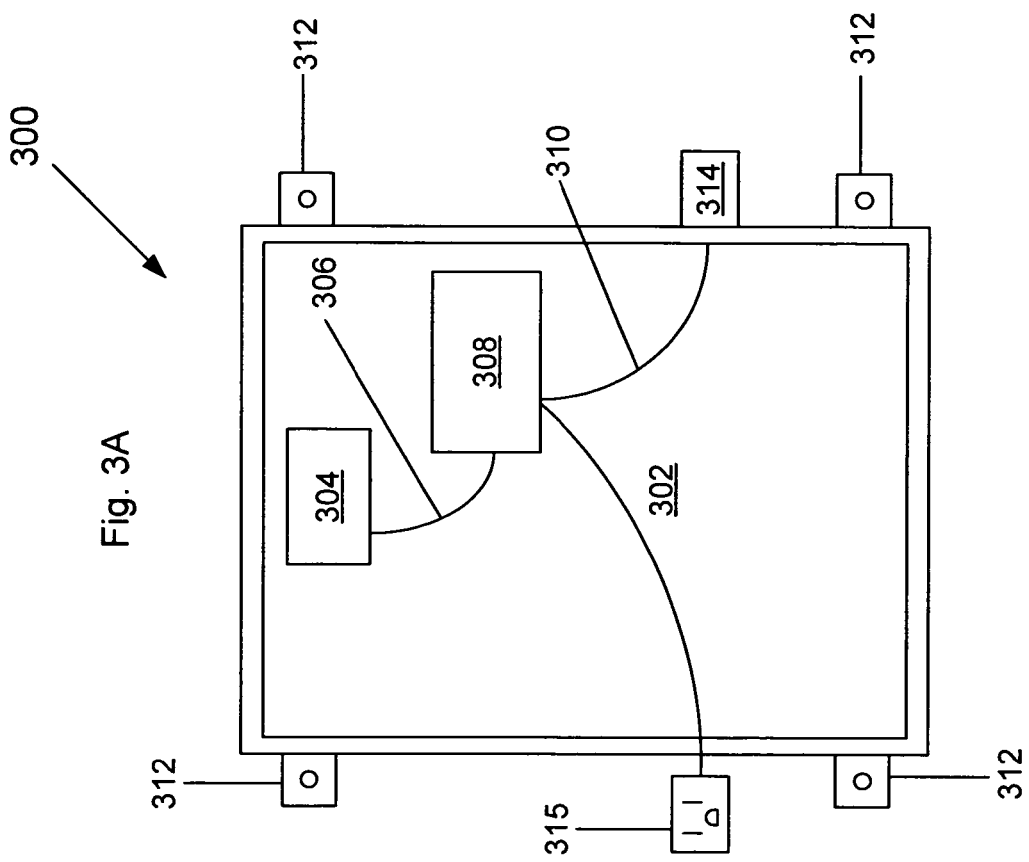

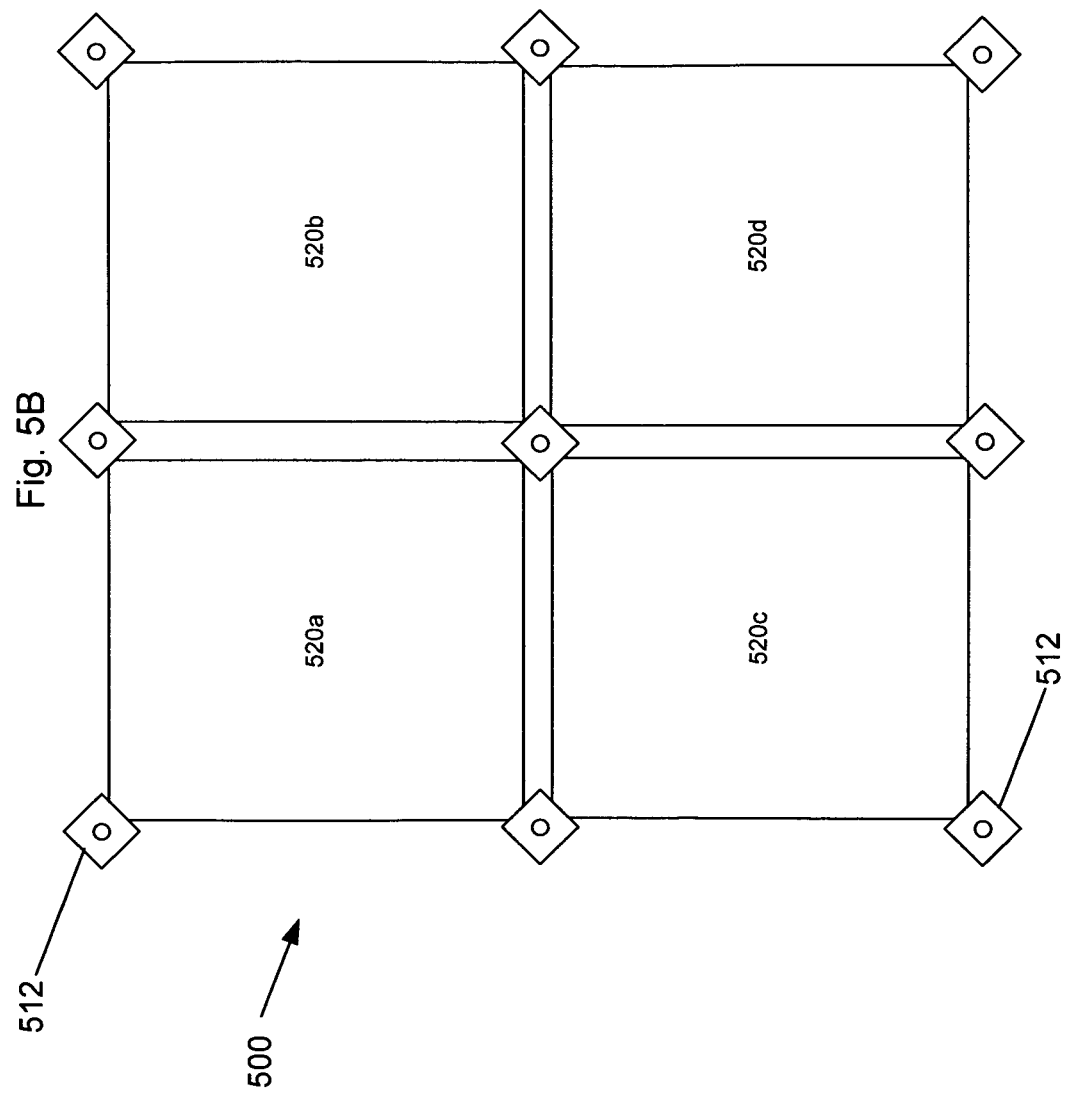

SOLAR ENERGY COLLECTION SYSTEMS AND METHODS

BACKGROUND OF INVENTION

1. Field of the Invention

The present invention is directed to systems and methods for collecting solar energy and converting it to electricity.

2. Background Art

US Patent Publication Number 2009/0296348 discloses an AC photovoltaic module including a DC photovoltaic module for converting solar energy to DC electrical power, and an inverter for converting DC electrical power to AC electrical power, the inverter being adapted for connection to a frame portion of the module and being sized and configured, and provided with arrangements of electrical components thereof, to dispense heat from the inverter, whereby to prolong operational life and reliability of the inverter. US Patent Publication Number 2009/0296348 is herein incorporated by reference in its entirety.

US Patent Publication Number 2009/0139562 discloses a portable, lightweight and detachable photovoltaic window system affording a resource for converting solar power in existing buildings and similar structures. At least one photovoltaic panel is interconnected to a building window or entrance casing or directly to a window pane through use of lanyards, hook and loop fasteners, or suction cups. Solar energy is captured from direct sunlight incidental to the location of the window. A panel may be removably supported by a fabric material interconnected to an interior wall via hook and loop fasteners. An inverter converts energy from DC to AC for powering electrically driven devices. A pocket is provided on the panel support for temporarily storing the auxiliary devices. This system enables a person with little knowledge of solar energy equipment a convenient and inexpensive method to convert sunlight into useful energy without major alterations to the building or window unit being used as a light-source. US Patent Publication Number 2009/0139562 is herein incorporated by reference in its entirety.

US Patent Publication Number 2009/0038673 discloses a portable power source kit. The kit includes a lower box having a lower box volume, a storage battery contained in the lower box volume and an upper box having an upper box volume and attachable to the lower box. A power adapter is contained in the upper box volume. The power adapter includes at least one or more inputs and at least one or more outputs. The power adapter is electrically connected to the storage battery. A power inverter is contained in the upper box volume. The inverter is electrically connected to the storage battery for providing DC to AC power conversion. And, a solar panel assembly is electrically connected to the power adapter where the assembly provides power to the power adapter for use in charging the storage battery and delivering power to the one or more outputs. US Patent Publication Number 2009/0038673 is herein incorporated by reference in its entirety.

There is a need in the art for one or more of the following:

An improved system and method of collecting solar energy and converting the energy to electricity and/or heat;

An improved system and method of connecting a solar energy collecting device to an existing structure;

An improved system and method of connecting a solar energy collecting device to other solar energy collecting devices.

SUMMARY OF INVENTION

In one aspect of the invention, there is disclosed a solar electricity system, comprising a solar collection surface adapted to convert light into DC electricity; a power inverter to convert the DC electricity into AC electricity; and a power cable connected to the power inverter, the power cable comprising a male plug on its distal end adapted to mate with a female power receptacle on a building structure.

In another aspect of the invention, there is disclosed a method of generating electricity, comprising mounting a solar electricity system on a roof of a building structure, the solar electricity system comprising a solar collection surface adapted to convert light into DC electricity; a power inverter to convert the DC electricity into AC electricity; and a power cable connected to the power inverter, the power cable comprising a male plug on its distal end; plugging the male plug into a female power receptacle on the building structure; and exposing the solar collection surface to sunlight.

Advantages of the invention may include one or more of the following:

An improved system and method of collecting solar energy and converting the energy to electricity and/or heat;

An improved system and method of connecting a solar energy collecting device to an existing structure;

An improved system and method of connecting a solar energy collecting device to other solar energy collecting devices.

BRIEF DESCRIPTION OF DRAWINGS

FIG. 2A shows a building structure with DC power collectors connected to the rack structure.

FIG. 3A shows a bottom view of a solar panel.

FIG. 3B shows a side view of the solar panel.

FIG. 5B shows a detailed view of a portion of a building structure with a solar panel array connected to the building structure.

DETAILED DESCRIPTION

Figure 1A:
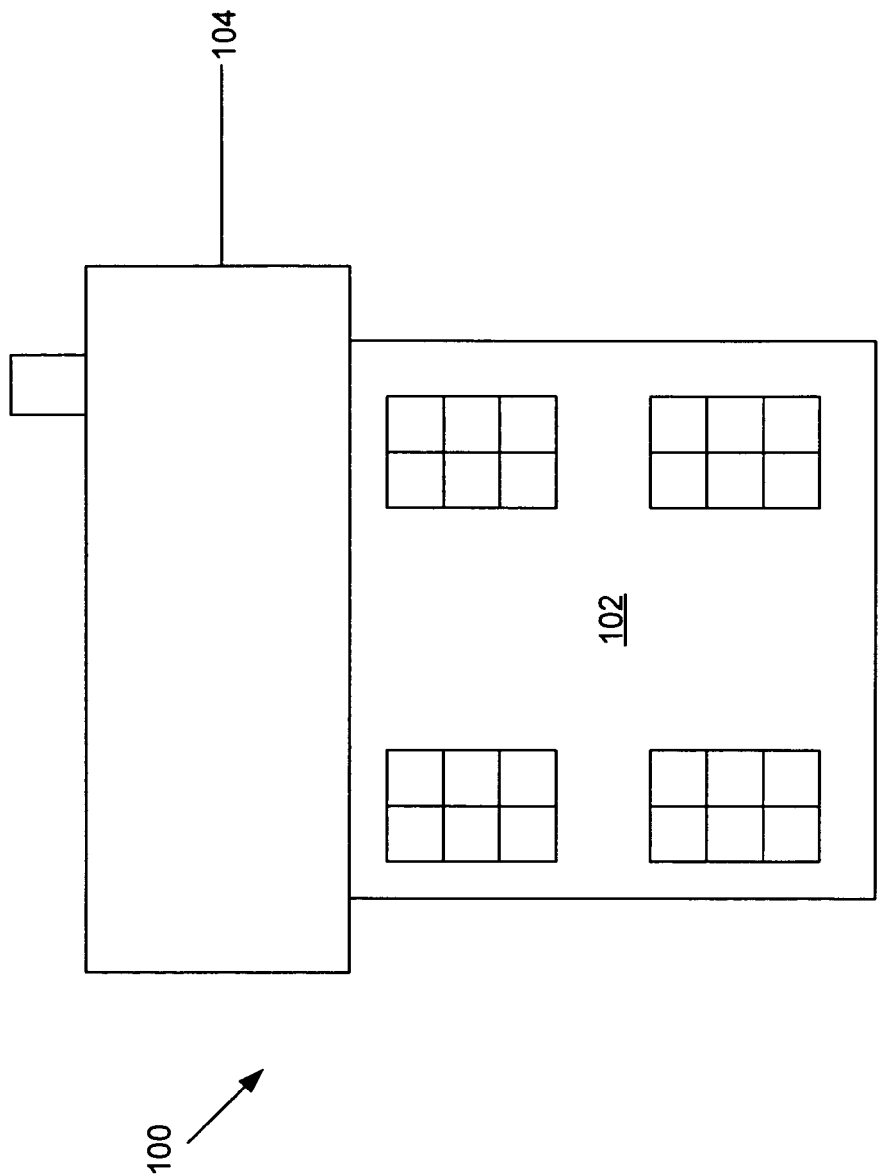
FIG. 1A shows a building structure with nothing installed on the roof.

FIG. 1:

Referring to FIG. 1a, prior art system 100 is shown. System 100 includes a structure 102 with a roof 104. Although structure of 102 is illustrated as a residential house, other suitable structures could include commercial buildings, industrial buildings, parking structures, or other structures as are known in the art.

Figure 1B:
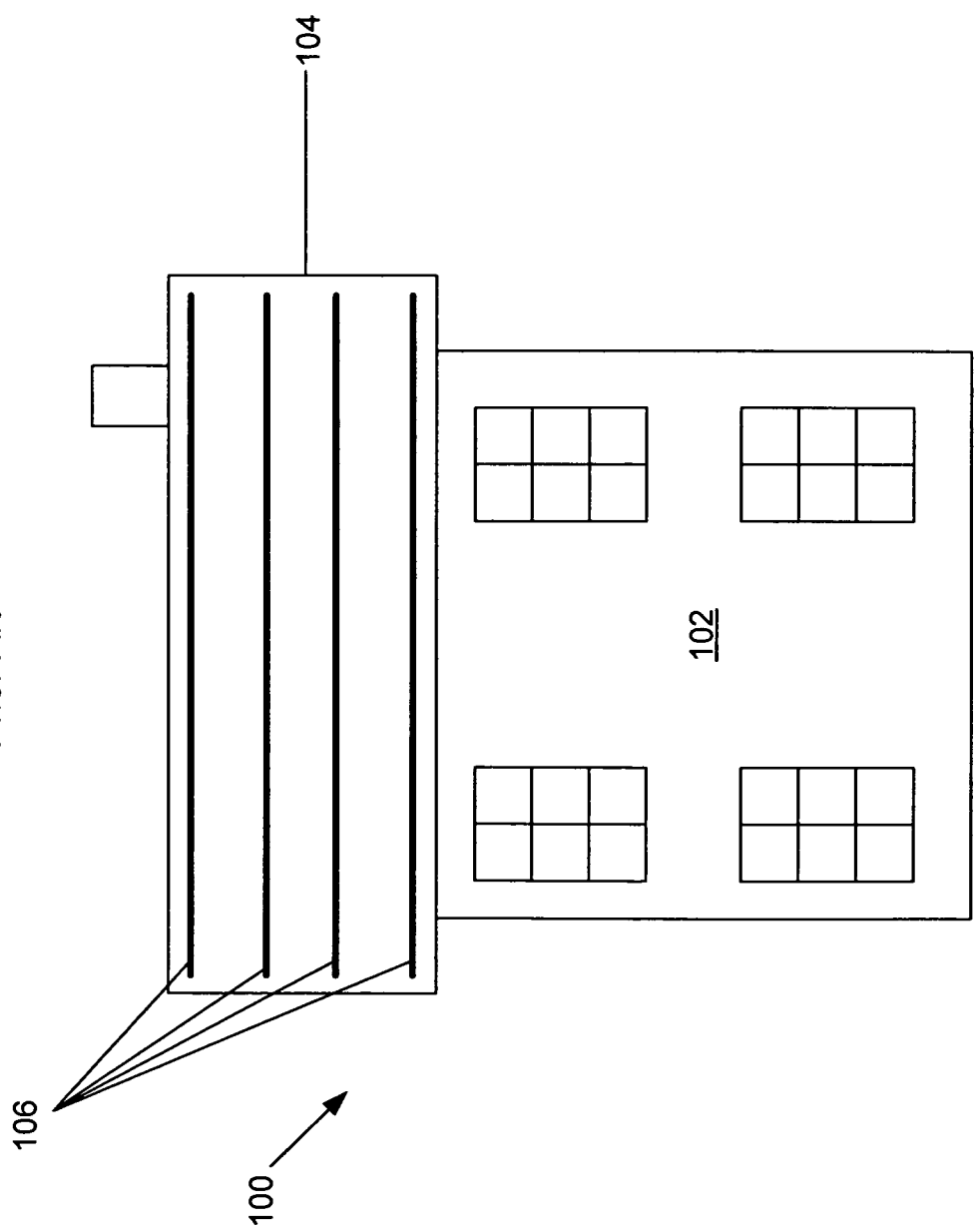
FIG. 1B shows a building structure with a rack structure installed on the roof.

Referring to FIG. 1b, the structure 102 with roof 104 is illustrated, with a racking system 106 installed on the roof 104.

Figure 1C:
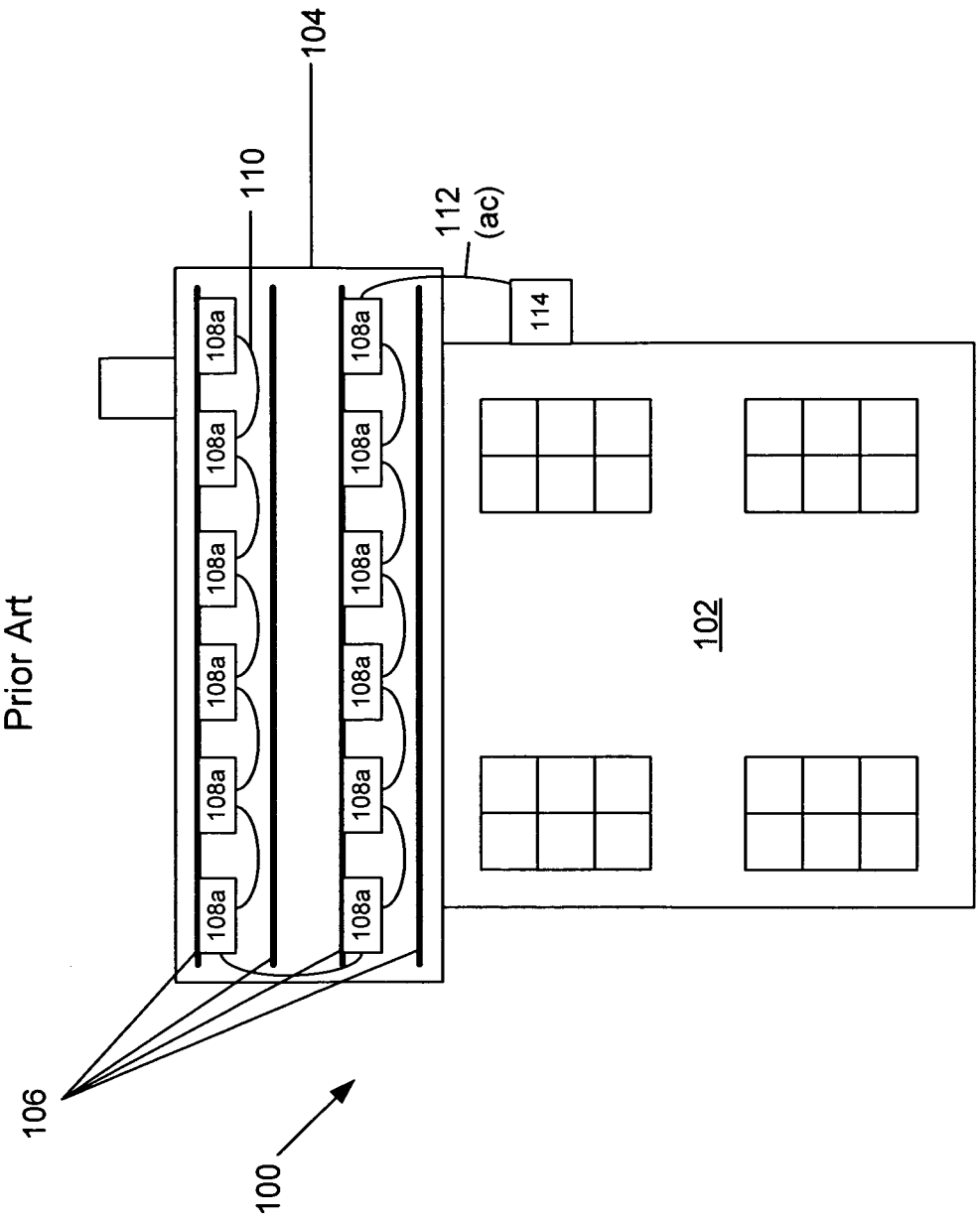
FIG. 1C shows a building structure with inverters connected to the rack structure.

Referring to FIG. 1c, the structure 102 with roof 104 and racking system 106 is illustrated, where a plurality of inverters 108a have been connected to the racking system 106. The inverters 108a are connected to each other in a daisy chain configuration by a plurality of connectors 110. At the end of the daisy chain, a power cord 112 of is used to connect inverters 108a to the structure 102 through box 114.

Figure 1D:
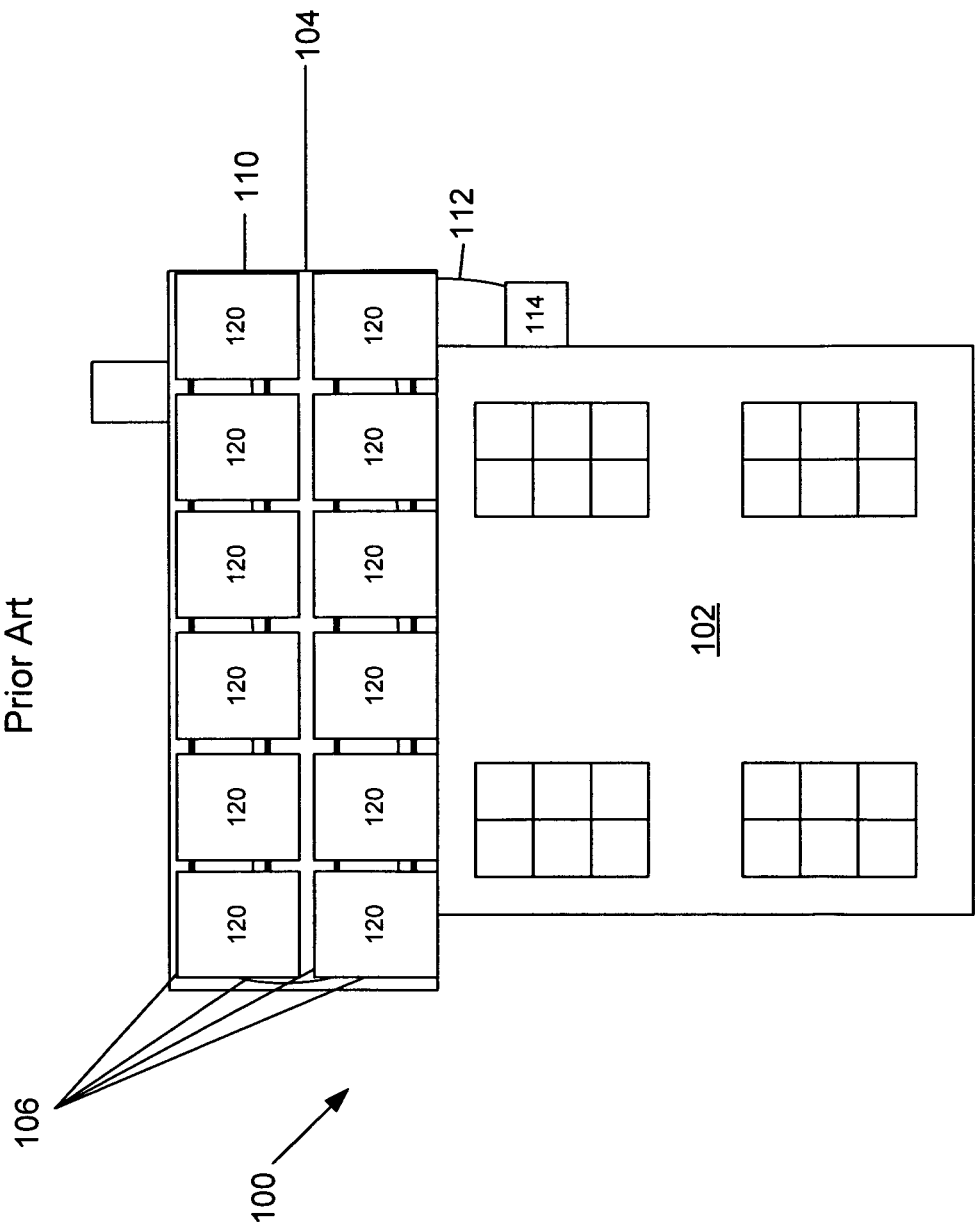
FIG. 1D shows a building structure with a solar panel array connected to the rack structure.

Referring to FIG. 1d, the structure 102 with roof 104, racking system 106, and a plurality of inverters 108a is illustrated. As shown, one solar collection panel 120 is connected to each of the inverters 108a. In operation, each solar collection panel 120 will be exposed to light, for example sunlight, which will create a DC current. Each inverter 108a will then convert the DC current into an AC current. The inverters 108a are connected to each other in a daisy chain structure to pass the AC current through the power cord 112 and into the structure 102.

The AC current may be used for current use in the structure 102; may be stored for later use in the structure, for example used to charge batteries; and/or may be sold to the grid for use in other structures.

FIG. 2:

Referring to FIG. 2a, the structure 202 with roof 204 and racking system 206 is illustrated, where a plurality of power collection points 218a have been connected to the racking system 206. The power collection points 218a are connected to each other in a daisy chain configuration by a plurality of connectors 210. At the end of the daisy chain, a power cord 212 of is used to connect power collection points 218a to an inverter 208, which is connected to the structure 202 with power cable 216 fed through box 214.

Figure 2B:
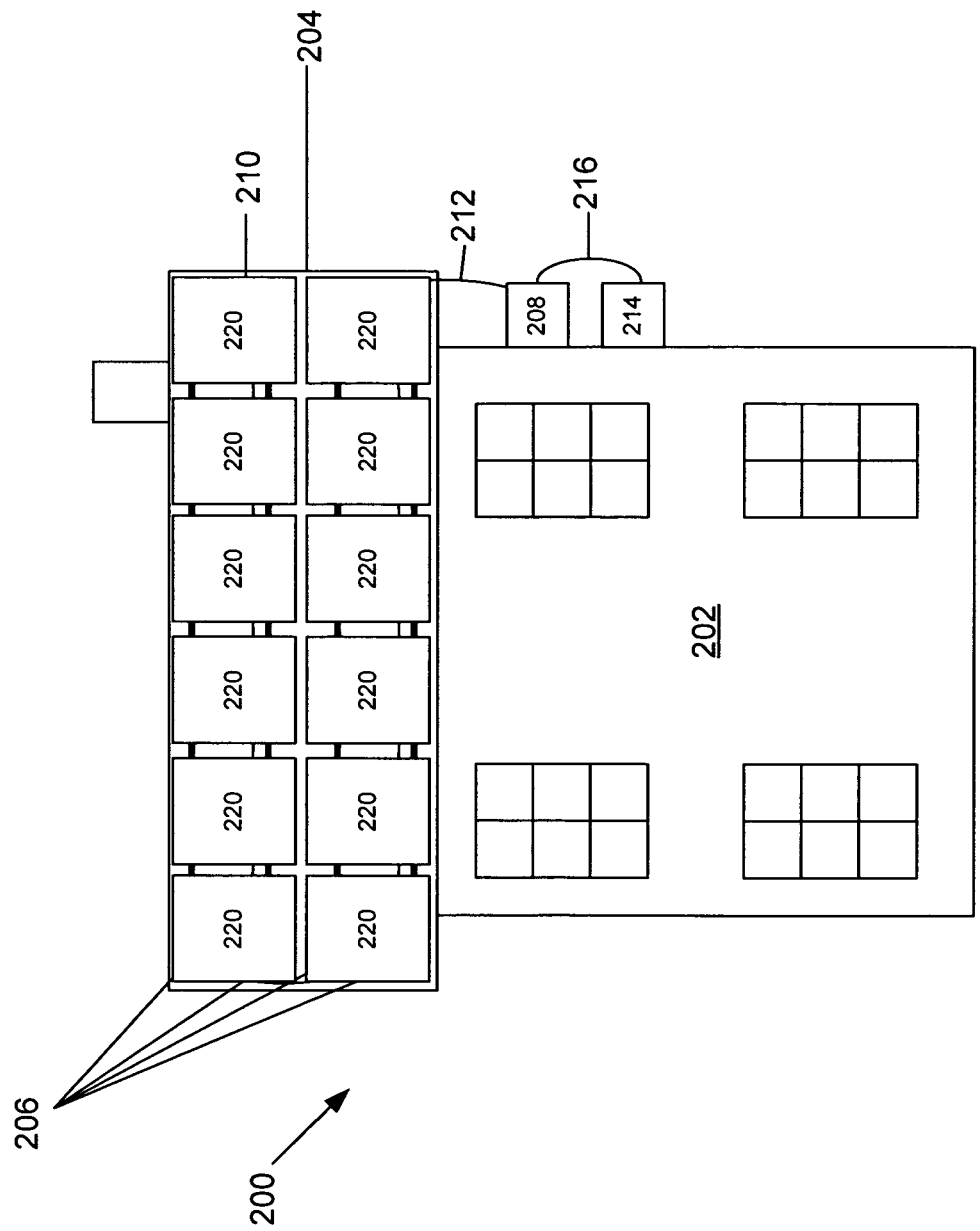
FIG. 2B shows a building structure with a solar panel array connected to the rack structure.

Referring to FIG. 2b, the structure 202 with roof 204, racking system 206, and a plurality of power collection points 218a is illustrated. As shown, one solar collection panel 220 is connected to each of the power collection points 218a. In operation, each solar collection panel 220 will be exposed to light, for example sunlight, which will create a DC current. Each power collection point 218a will then collect the DC current from each panel that it's connected to. The power collection points 218a are connected to each other in a daisy chain structure to pass the DC current through the power cord 212 and to an inverter 208 which converts the DC Power into AC power which is fed through power cable 216 and into the structure 202 through box 214.

FIG. 3:

Referring to FIG. 3a, a bottom view of a solar panel collection system 300 is illustrated. The system 300 includes a solar collection surface 302, for example a collection of silicon photovoltaic cells. The solar collection surface 302 converts light into a DC current, which is aggregated at outlet 304. The DC current is fed through DC Power cable 306 to inverter 308. Inverter 308 converts the DC current into AC current. A female AC receptacle 314 is connected to the inverter 308 with power cable 310 and mounted on the system 300. A male AC cable and plug 315 are also connected to the inverter 308. One anchor 312 is provided on each corner of the system 300 in order to connect the system to a roof or other structure.

Referring to FIG. 3b, a side view of a solar panel collection system 300 is illustrated. The side view shows the solar collection surface 302 on top of the system 300, with the other components 304 and 308 mounted underneath the solar collection surface 302. The female AC receptacle 314 is mounted on the side of the system, and male AC cable and plug 315 are flexibly attached to the system which allows the plug 315 to be plugged into an adjacent solar panel collection system (not shown) or to be plugged into a receptacle on a structure.

In operation, a system 300 may be connected to a structure, for example the roof of the structure, or a residential roof, by driving connectors through each anchor 312 and into the structure. Suitable connectors include nails, spikes, screws, or bolts, or other connectors as are known in the art. Once the system 300 has been connected to the structure, male AC cable and plug 315 can be plugged into an adjacent receptacle on the structure.

In some embodiments, if it is desired to install a second system on the structure, the male AC cable and plug of the second system can be plugged into the female AC receptacle 314 of the first system 300. And further successive systems (third, fourth, fifth, etc.) can be connected to the structure and to each other in a daisychain arrangement by connecting each successive system to the previous system. In addition, new daisy chains can be started so that multiple daisy chains are each connected to the structure.

In some embodiments, male AC cable and plug 315 may be compatible with AC receptacle 314.

In some embodiments, male AC cable and plug 315 and AC receptacle 314 may be a 110 volt U.S. Type B system, for example a NEMA 5-15 or NEMA 5-20 plug and receptacle.

In some embodiments, male AC cable and plug 315 and AC receptacle 314 may be a 240 volt system, for example a NEMA 14-30 or 14-50, or a locking NEMA L14-20 or L14-30 plug and receptacle.

In some embodiments, male AC cable and plug 315 and AC receptacle 314 are compatible with AC receptacles of the structure where the system 300 is installed.

Figure 4B:
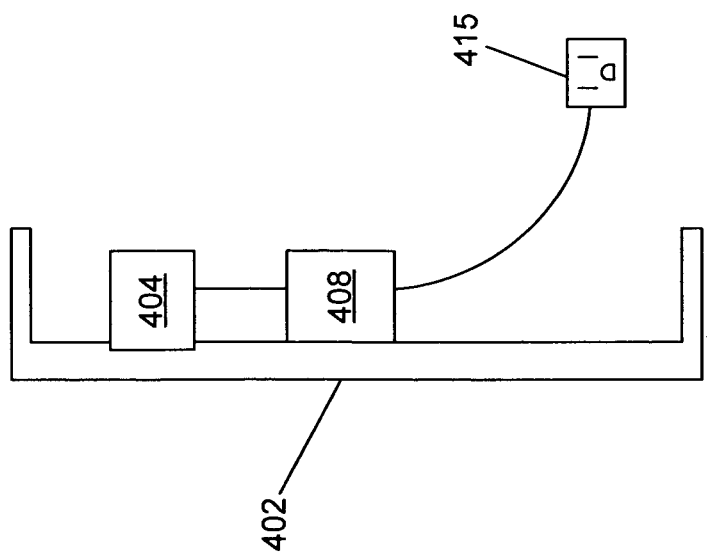
FIG. 4B shows a side view of the solar panel.
Figure 4A:
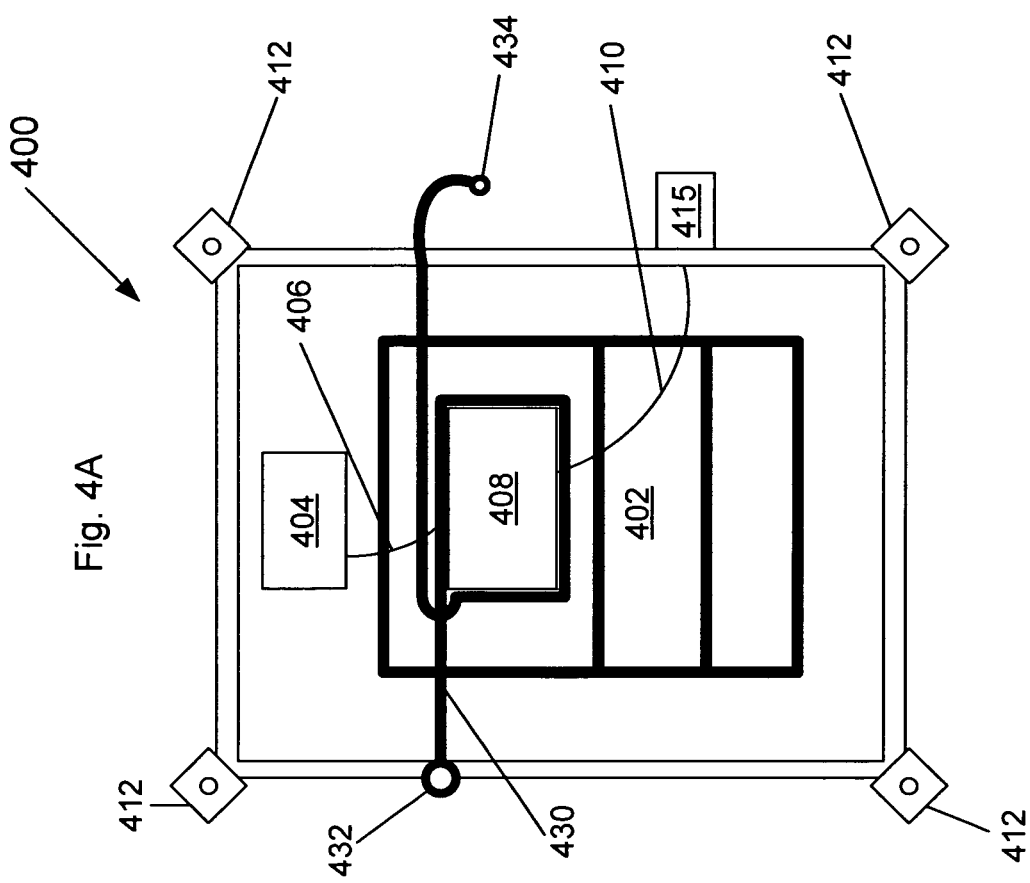
FIG. 4A shows a bottom view of a solar panel.

FIG. 4:

Referring to FIG. 4a, a bottom view of a solar panel collection system 400 is illustrated. The system 400 includes a solar collection surface 402, for example a collection of silicon photovoltaic cells. The solar collection surface 402 converts light into a DC current, which is aggregated at outlet 404. The DC current is fed through DC Power cable 406 to inverter 408. Inverter 408 converts the DC current into AC current. A male AC cable and plug 415 are connected to the inverter 408. One anchor 412 is provided on each corner of the system 400 in order to connect the system to a roof or other structure.

System 400 also includes a water heating system. A cold water inlet is provided up with a female hose connector 432, and a hot water outlet is provided with a male hose connector 434. A cold water flows through water tubes 430 connected between them this e-mail hose connector 432 in the mail hose connector 434.

As shown in the Figure, one part of the tube 430 is wrapped around inverter 408 in order to heat the water within the tube while cooling the inverter. Other parts of tube 430 is mounted beneath the solar collection surface 402 in order to heat the water within the tubes and cool the solar collection surface.

In some embodiments, multiple water heating systems can be connected together in a daisychain configuration where the male connector 434 of one panel is connected to the female connector 432 of the adjacent panel.

In operation, a cold water supply from the building structure may be fed to the female connector 432 of the first system 400 in the daisychain, and hot water may be taken from the male connector 434 of the last system 400 in the daisychain for use in the building structure.

The water heating system may serve to provide hot water for use in building structure as well as lower the operating temperature of the inverter 408 and the solar collection surface 402, which may serve to boost their efficiency.

Referring to FIG. 4b, a side view of a solar panel collection system 400 is illustrated. The side view shows the solar collection surface 402 on top of the system 400, with the other components 404 and 408 mounted underneath the solar collection surface 402. The male AC cable and plug 415 are flexibly attached to the system which allows the plug 415 to be plugged into a power collection system, such as a power strip (not shown) or to be plugged into a receptacle on a structure.

In operation, a system 400 may be connected to a structure, for example the roof of the structure, or a residential roof, by driving connectors through each anchor 412 and into the structure. Suitable connectors include nails, spikes, screws, or bolts, or other connectors as are known in the art. Once the system 400 has been connected to the structure, male AC cable and plug 415 can be plugged into an adjacent receptacle on the structure.

In some embodiments, if it is desired to install a second system on the structure, the male AC cable and plug of the second system can be plugged into an adjacent receptacle on the structure or multiple systems can be aggregated at a single location, such as a power strip, which can then be plugged into an adjacent receptacle on the structure. And further successive systems (third, fourth, fifth, etc.) can be connected to the structure and to a single location with multiple female power receptacles by connecting each successive system to the single location then connecting a male connector from the single location into an adjacent receptacle on the structure. In addition, new single power aggregation locations with multiple female power receptacles can be used with other strings of solar systems so that multiple strings are each connected to the structure.

Figure 5A:
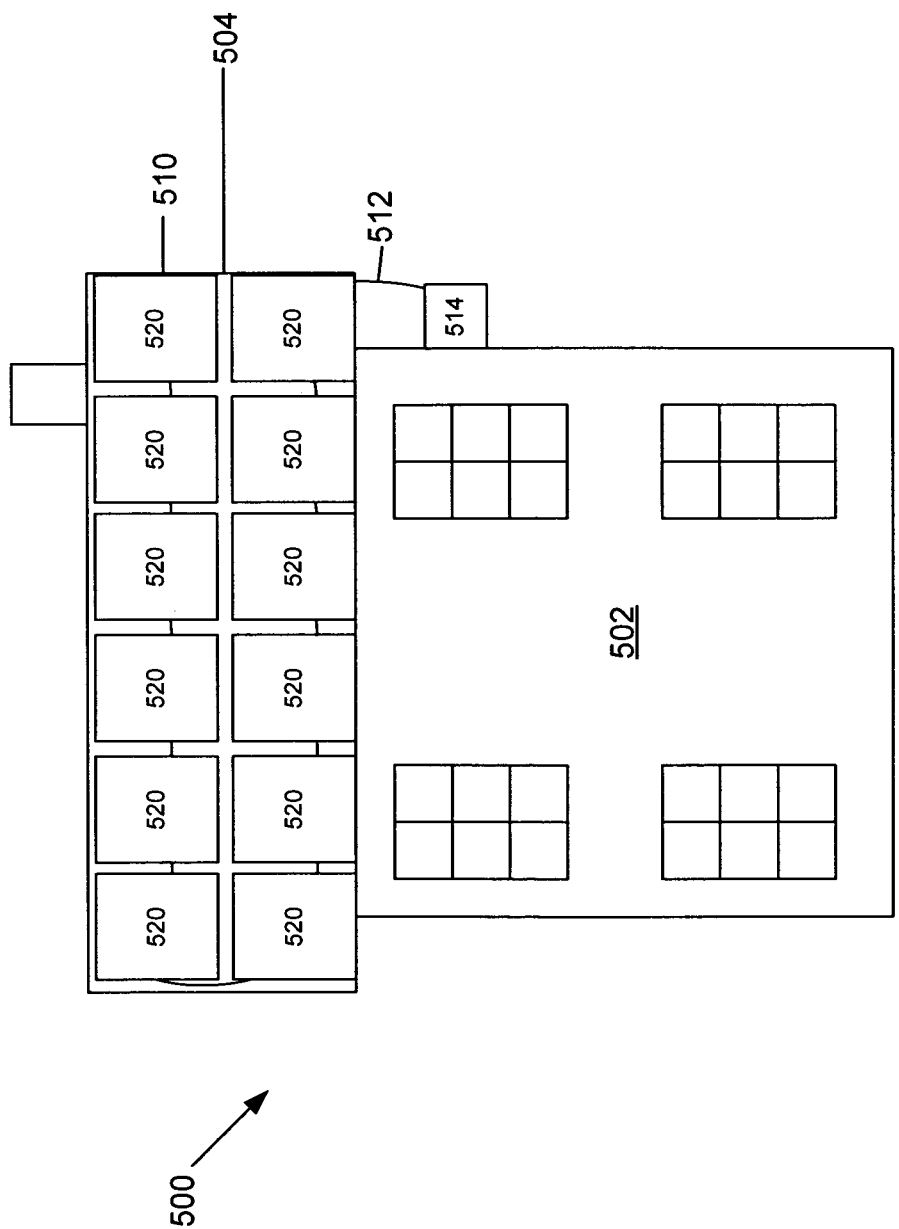
FIG. 5A shows a building structure with a solar panel array connected to the building structure.

FIG. 5:

Referring to FIG. 5a, the structure 502 with roof 504, and a plurality of solar collection panels 520 each connected to the roof 504. In operation, each solar collection panel 520 will be exposed to light, for example sunlight, which will create a DC current, which will converted to an AC current by an inverter connected to the panel 520. In one embodiment, each panel's inverter may then be connected to the next panel's inverter in a daisy chain structure using male and female plugs and receptacles to pass the AC current through the power cord 512 and to a male plug at the end of the power cord 512 which is plugged into a female receptacle 514.

In another embodiment, each panel's inverter may be connected to a power cord with a male plug at the end. Each male plug may be plugged into a power aggregator with a plurality of female receptacles, for example a power strip. The power aggregator may then have a male plug a at the end of a power cord 512 which is plugged into a female receptacle 514 connected to the structure 502.

Referring to FIG. 5b, a detailed view of a solar collection system 500 for attaching the plurality of solar collection panels 520 to the roof 504 is shown. Each panel 520a, 520b, 520c, and 520d has four mounting plates 512 attached to each corner of the panel. As shown, panel 520a has a upper left mounting plate 512 which does not overlap with any of the other panels. Panel 520a has an upper right mounting plate 512 which overlaps with the upper left mounting plate of panel 520b, such that a single connector can be used to attach the upper right mounting plate of panel 520a and the upper left mounting plate of panel 520b to the structure. Panel 520a has a lower left mounting plate 512 which overlaps with the upper left mounting plate of panel 520c, so that those two mounting plates only require a single connector. Panel 520a also has a lower right mounting plate 512 which overlaps with the lower left mounting plate of panel 520b, the upper right mounting plate of panel 520c, the upper left mounting plate of panel 520d, so that those four mounting plates only require a single connector. By overlapping the mounting plates in this manner, fewer connectors may be used and the panels can be attached to the structure more efficiently.

In some embodiments, each of the mounting plates 512 may be pivotally connected to the panels 520. The plates may be connected by a single point pivot (not shown) that would allow easier mounting and overlapping with adjacent panels.

Illustrative Embodiments

In one embodiment, there is disclosed a solar electricity system, comprising a solar collection surface adapted to convert light into DC electricity; a power inverter to convert the DC electricity into AC electricity; and a power cable connected to the power inverter, the power cable comprising a male plug on its distal end adapted to mate with a female power receptacle on a building structure. In some embodiments, the system also comprises a second power cable connected to the power inverter, the second power cable comprising a female power receptacle on its distal end. In some embodiments, the male plug comprises a 110 volt U.S. Type B plug comprising a hot, a neutral, and a ground prong. In some embodiments, the male plug comprises a 220 volt Nema 14-30 or Nema 14-50 plug comprising two hot, a neutral, and a ground prong. In some embodiments, the female receptacle comprises a 110 volt U.S. Type B receptacle comprising a hot, a neutral, and a ground slot. In some embodiments, the system also comprises a second solar collection surface adapted to convert light into DC electricity; a second power inverter to convert the DC electricity into AC electricity; and a second power cable connected to the second power inverter, the second power cable comprising a second male plug on its distal end adapted to mate with a second female power receptacle on a building structure. In some embodiments, the system also comprises a second solar collection surface adapted to convert light into DC electricity; a second power inverter to convert the DC electricity into AC electricity; and a second power cable connected to the second power inverter, the second power cable comprising a second male plug on its distal end adapted to mate with a female power receptacle; and a power aggregation point comprising a plurality of female power receptacles, a first female power receptacle mated with the male plug, and a second female power receptacle mated with the second male plug, the power aggregation point further comprising a third power cable comprising a third male plug on its distal end adapted to mate with a female power receptacle on a building structure. In some embodiments, the system also comprises a second solar collection surface adapted to convert light into DC electricity; a second power inverter to convert the DC electricity into AC electricity; and a third power cable connected to the second power inverter, the third power cable comprising a third male plug on its distal end adapted to mate with the female power receptacle on the distal end of the second power cable. In some embodiments, the system also comprises a water heating system comprising a thermally conductive water conduit at least partially wrapped around the power inverter, the water conduit adapted to receive heat from the power inverter and heat the water flowing therethrough. In some embodiments, a first portion of the water conduit is wrapped around the power inverter, and a second portion of the water conduit is mounted to a bottom side of the solar collection surface. In some embodiments, the system also comprises a mounting bracket connected to each corner of the solar collection surface, each mounting bracket comprising a hole therethrough adapted to receive a fastener to mount the system to a building structure. In some embodiments, at least one of the mounting brackets are pivotally connected to the corner of the solar collection surface.

In one embodiment, there is disclosed a solar electricity system, comprising a solar collection surface adapted to convert light into DC electricity; a power inverter to convert the DC electricity into AC electricity; and a first set of mounting brackets connected to the solar collection surface, each mounting bracket comprising a hole therethrough adapted to receive a fastener to mount the system to a building structure. In some embodiments, at least one of the mounting brackets are connected to a corner of the solar collection surface. In some embodiments, at least one of the mounting brackets are pivotally connected to a corner of the solar collection surface. In some embodiments, the first set of mounting brackets comprises four (4) mounting brackets, each mounting bracket is pivotally connected to a corner of the solar collection surface. In some embodiments, the system also comprises a second solar collection surface adapted to convert light into DC electricity; a second power inverter to convert the DC electricity into AC electricity; a second set of mounting brackets connected to each corner of the second solar collection surface, each mounting bracket comprising a hole therethrough adapted to receive a fastener to mount the system to a building structure; wherein at least one mounting bracket of the first set has a hole aligned with a hole of at least one mounting bracket of the second set, such that a single fastener can be passed through the mounting bracket of the first set and the mounting bracket of the second set in order to mount both systems to a building structure.

In one embodiment, there is disclosed a method of generating electricity, comprising mounting a solar electricity system on a roof of a building structure, the solar electricity system comprising a solar collection surface adapted to convert light into DC electricity; a power inverter to convert the DC electricity into AC electricity; and a power cable connected to the power inverter, the power cable comprising a male plug on its distal end; plugging the male plug into a female power receptacle on the building structure; and exposing the solar collection surface to sunlight. In some embodiments, the method also comprises mounting a plurality of solar electricity systems on the roof, and plugging each of their male plugs into a power strip, which is then a female power receptacle on the building structure. In some embodiments, the solar electricity system further comprises a female power receptacle connected to the power inverter, further comprising creating a daisychain of multiple solar electricity systems by plugging the male plug of a first solar electricity system into a female receptacle of a second solar electricity system.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A solar electricity system, comprising:
    a solar collection surface adapted to convert light into DC electricity;
    a power inverter to convert the DC electricity into AC electricity; and
    a power cable connected to the power inverter, the power cable comprising a male plug on its distal end adapted to mate with a female power receptacle on a building structure,
    wherein the male plug is selected from the group consisting of a 110 volt U.S. Type B plug, a 110 volt Nema 5-15 plug, a 110 volt Nema 5-20 plug, a 220 volt Nema 14-30 plug, a 220 volt Nema 14-50 plug, a 220 volt Nema L14-20 plug, and a 220 volt Nema L14-30 plug;
    the power inverter comprising a female power receptacle;
    a second solar collection surface adapted to convert light into DC electricity;
    a second power inverter to convert the DC electricity into AC electricity; and
    a second male power cable connected to the second power inverter, the second male power cable comprising a second male plug on its distal end adapted to mate with the female power receptacle on the power inverter.

2. The system of claim 1, further comprising
    a second female power cable connected to the power inverter, the second power cable comprising the female power receptacle on its distal end.

3. The system of claim 1, wherein the male plug comprises a 110 volt U.S. Type B plug comprising a hot, a neutral, and a ground prong.

4. The system of claim 1, wherein the male plug comprises a 220 volt Nema 14-30 or Nema 14-50 plug comprising two hot, a neutral, and a ground prong.

5. The system of claim 2, wherein the female receptacle comprises a 110 volt U.S. Type B receptacle comprising a hot, a neutral, and a ground slot.

6. The system of claim 1, further comprising
    a water heating system comprising a thermally conductive water conduit at least partially wrapped around the power inverter, the water conduit adapted to receive heat from the power inverter and heat the water flowing therethrough.

7. The system of claim 6, wherein a first portion of the water conduit is wrapped around the power inverter, and a second portion of the water conduit is mounted to a bottom side of the solar collection surface.

8. The system of claim 1, further comprising
    a mounting bracket connected to each corner of the solar collection surface, each mounting bracket comprising a hole therethrough adapted to receive a fastener to mount the system to a building structure.

9. The system of claim 8, wherein at least one of the mounting brackets are pivotally connected to the corner of the solar collection surface.

10. A method of generating electricity, comprising:
    mounting a solar electricity system on a roof of a building structure, the solar electricity system comprising a solar collection surface adapted to convert light into DC electricity;
    a power inverter to convert the DC electricity into AC electricity; and
    a power cable connected to the power inverter, the power cable comprising a male plug on its distal end plugging the male plug into a female power receptacle on the building structure; and
    exposing the solar collection surface to sunlight,
    wherein the male plug is selected from the group consisting of a 110 volt U.S. Type B plug, a 110 volt Nema 5-15 plug, a 110 volt Nema 5-20 plug, a 220 volt Nema 14-30 plug, a 220 volt Nema 14-50 plug, a 220 volt Nema L14-20 plug, and a 220 volt Nema L14-30 plug;
    a female power receptacle connected to the power inverter, further comprising creating a daisychain of multiple solar electricity systems by plugging the male plug of a first solar electricity system into a female receptacle of a second solar electricity system.

* * * * *